United States Patent
Shin et al.

(10) Patent No.: US 8,975,173 B2
(45) Date of Patent: Mar. 10, 2015

(54) SEMICONDUCTOR DEVICE WITH BURIED GATE AND METHOD FOR FABRICATING THE SAME

(71) Applicant: SK Hynix Inc., Gyeonggi-do (KR)

(72) Inventors: Jong-Han Shin, Gyeonggi-do (KR); Bo-Min Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/149,498

(22) Filed: Jan. 7, 2014

(65) Prior Publication Data

US 2014/0120710 A1     May 1, 2014

Related U.S. Application Data

(62) Division of application No. 13/028,556, filed on Feb. 16, 2011, now abandoned.

(30) Foreign Application Priority Data

Dec. 15, 2010   (KR) .................. 10-2010-0128045

(51) Int. Cl.
  H01L 21/3205   (2006.01)
  H01L 21/768   (2006.01)
  H01L 27/108   (2006.01)
  H01L 21/28   (2006.01)

(52) U.S. Cl.
  CPC .... H01L 21/76879 (2013.01); H01L 21/76816 (2013.01); H01L 27/10855 (2013.01); H01L 27/10876 (2013.01); H01L 27/10894 (2013.01); H01L 21/28008 (2013.01)
  USPC ..................... 438/589; 257/E21.19

(58) Field of Classification Search
  None
  See application file for complete search history.

(56) References Cited

U.S. PATENT DOCUMENTS

2004/0241940 A1* 12/2004 Lee et al. ............... 438/256
2011/0133261 A1* 6/2011 Kim ....................... 257/296

* cited by examiner

*Primary Examiner* — Wensing Kuo
(74) *Attorney, Agent, or Firm* — IP & T Group LLP

(57) ABSTRACT

A semiconductor device includes buried gates formed over a substrate, storage node contact plugs which are formed over the substrate and include a pillar pattern and a line pattern disposed over the pillar pattern, and a bit line structure which is formed over the substrate and isolates adjacent ones of the storage node contact plugs from each other.

18 Claims, 17 Drawing Sheets

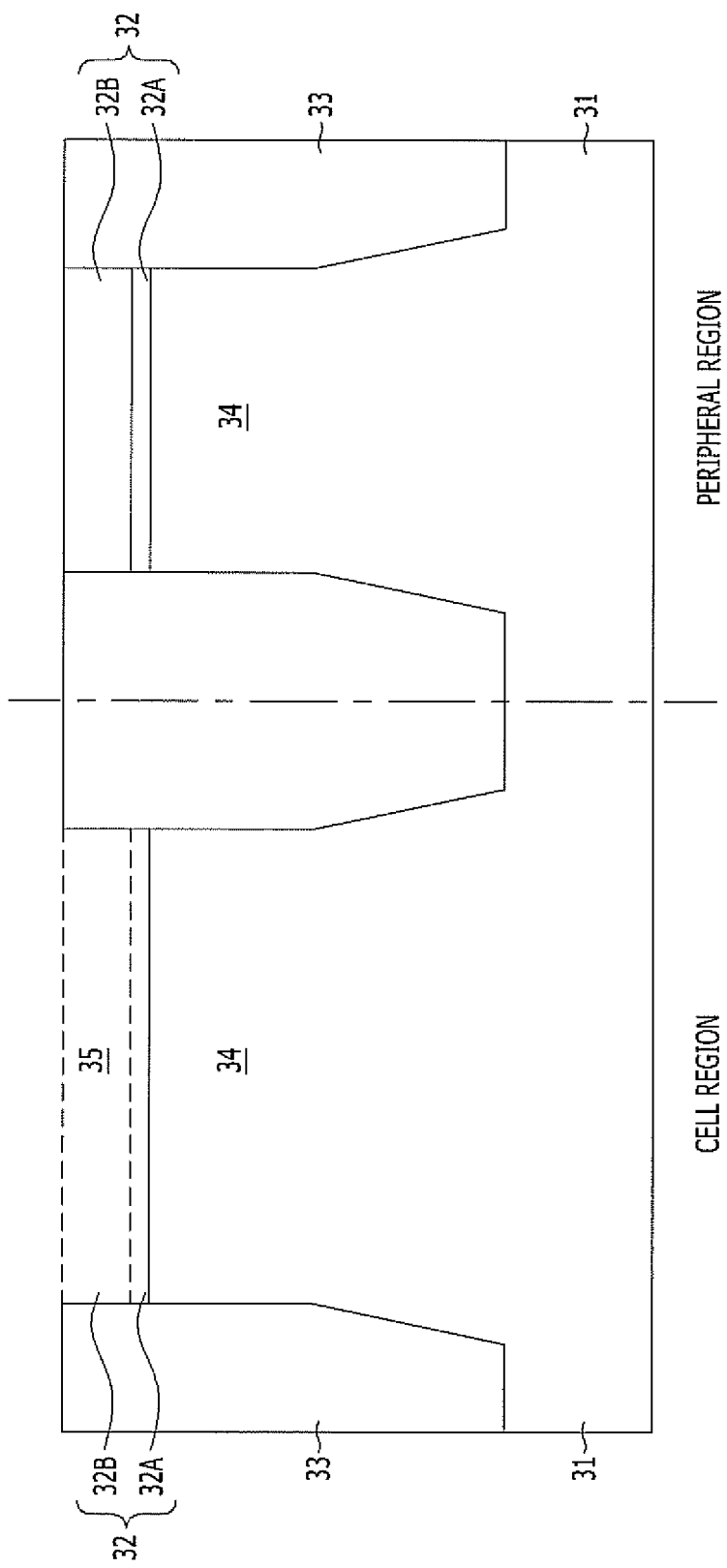

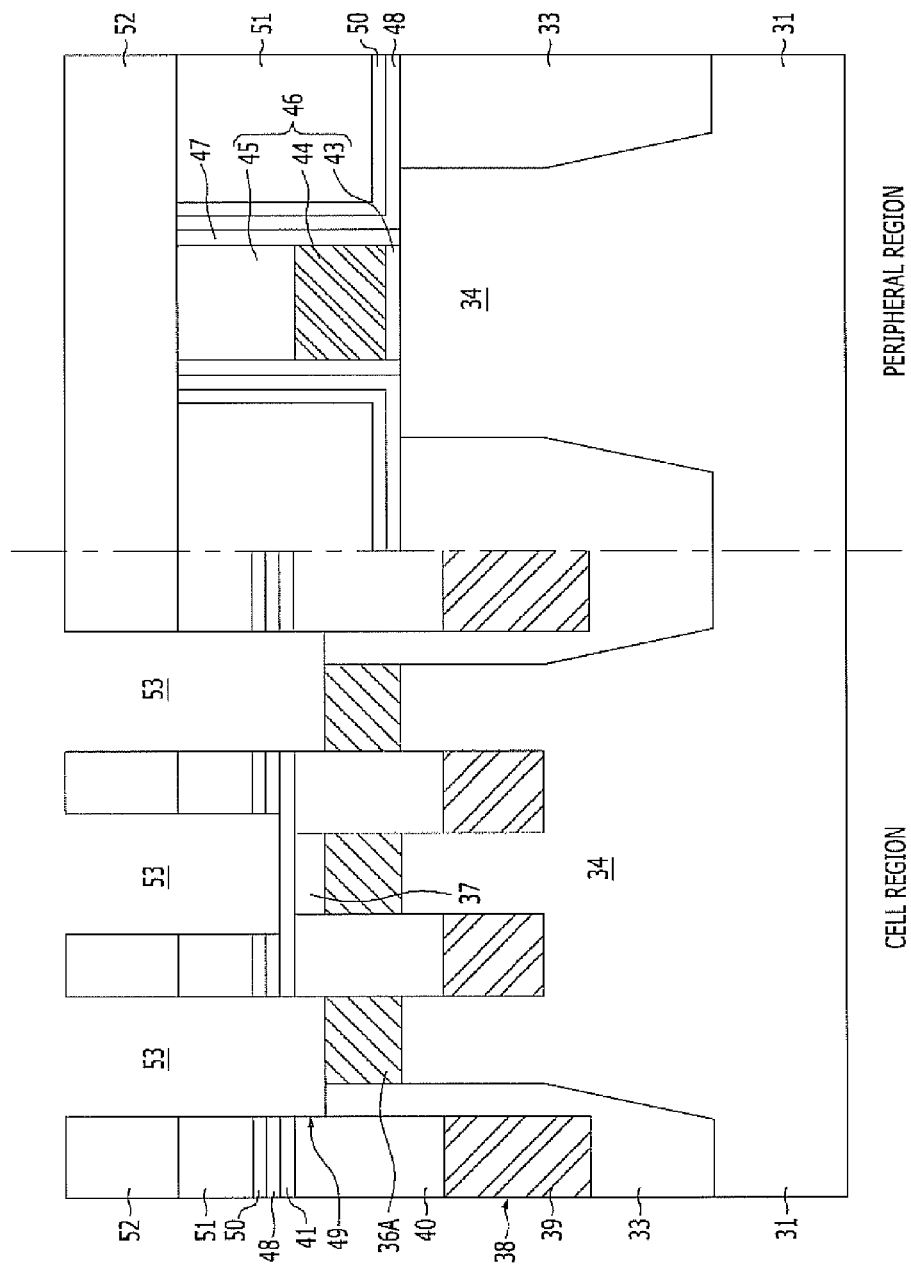

SEMICONDUCTOR DEVICE WITH BURIED GATE AND METHOD FOR FABRICATING THE SAME

CROSS-REFERENCE TO RELATED APPLICATIONS

This application is a division of U.S. patent application Ser. No. 13/028,556 filed on Feb. 16, 2011, which claims priority of Korean Patent Application No. 10-2010-0128045, filed on Dec. 15, 2010. The disclosure of each of the foregoing application is incorporated herein by reference in its entirety.

BACKGROUND OF THE INVENTION

Exemplary embodiments of the present invention relate to a technology for fabricating a semiconductor device, and more particularly, to a semiconductor device with buried gates (BG) and a method for fabricating the same.

As the size of semiconductor devices shrinks, compliance with diverse device characteristics and designing appropriate fabrication processes become more difficult. For example, in using 40 nm design rules, formation of structures of gates, bit lines, and contacts is reaching limits. Even if such small structures can be formed, desired device characteristics may not be obtained. To address such features, buried gate (BG) structures having gates buried in a substrate are used, FIGS. 1A and 1B illustrate a conventional semiconductor device with buried gates. FIG. 1A is a plan view, and FIG. 1B is a cross-sectional view of the semiconductor device of FIG. 1A along line A-A'.

Referring to FIGS. 1A and 1B, a plurality of buried gates are formed over a substrate 11 having active regions 13 defined by an isolation layer 12, and landing plugs 14 are formed over the active regions 13 between the buried gates and the isolation layer 12. Each buried gate includes a trench 15 formed over the substrate 11, a gate insulation layer (not shown) on the surface of the trench 15, a gate electrode 16 filling a portion of the trench 15, and a gate sealing layer 17 filling the other portion of the trench 15. An inter-layer dielectric layer 18 is formed over the substrate 11 where the buried gates are formed. Storage node contact plugs 20 and bit lines 23 are formed over the inter-layer dielectric layer 18. Herein, a reference numeral '19' denotes storage node contact holes, and a reference numeral '21' denotes a damascene pattern. A reference numeral '22' denotes bit line spacers, and a reference numeral '24' denotes a bit line sealing layer.

According to the conventional technology, the storage node contact plugs 20 are formed after the bit lines 23 are formed. Here, using the conventional technology, the process margins of the process of forming the storage node contact plugs 20 may be decreased due to the presence of the bit lines 23. To address such a feature, a method of forming the storage node contact plugs 20 first and then forming the bit lines 23 was suggested. In such a method, a short may easily occur between the storage node contact plugs 20 and the land plugs 14 under the bit lines 23.

In addition, according to the conventional technology, the contact area between the landing plugs 14 and the storage node contact plugs 20 may be decreased since the storage node contact holes 19 are formed by etching the inter-layer dielectric layer 18 is etched at one step, for example, without consideration of the way that the formation of the storage node contact plugs 20 takes place, where the sidewalls of the storage node contact holes 19 are formed slanted due to etch characteristics.

SUMMARY OF THE INVENTION

An embodiment of the present invention is directed to a semiconductor device including buried gates which may increase the process margins of a storage node contact plug formation process, and a method for fabricating the same.

Another embodiment of the present invention is directed to a semiconductor device including buried gates which may prevent a short from being formed between storage node contact plugs and landing plugs under bit lines, and a method for fabricating the same.

Another embodiment of the present invention is directed to a semiconductor device including buried gates which may improve the contact margins of storage node contact plugs, and a method for fabricating the same.

In accordance with an embodiment of the present invention, a semiconductor device includes: buried gates formed over a substrate; storage node contact plugs which are formed over the substrate and include a pillar pattern and a line pattern disposed over the pillar pattern; and a bit line structure which is formed over the substrate and isolates adjacent ones of the storage node contact plugs from each other.

In accordance with another embodiment of the present invention, a method for fabricating a semiconductor device includes: forming a first layer over a substrate; forming a first pattern which exposes the substrate by selectively etching the first layer; forming a second layer to cover the substrate; forming a line-type second pattern coupled with the first pattern by selectively etching the second layer; forming a conductive layer to fill the first pattern and the second pattern; and forming contact plugs by selectively etching the conductive layer.

In accordance with yet another embodiment of the present invention, a method for fabricating a semiconductor device includes: forming buried gates over a substrate; forming a first layer over the substrate; forming a first pattern by selectively etching the first layer; forming a second layer over the substrate including the first pattern; forming a line-type second pattern coupled with the first pattern by selectively etching the second layer; forming a conductive layer that fills storage node contact holes including the first pattern and the second pattern; and forming storage node contact plugs by selectively etching the conductive layer, the second layer, and the first layer to form a damascene pattern simultaneously.

BRIEF DESCRIPTION OF THE DRAWINGS

FIGS. 4A to 4K are cross-sectional views illustrating a method for fabricating a semiconductor device including buried gates in accordance with an embodiment of the present invention.

DESCRIPTION OF SPECIFIC EMBODIMENTS

Figure 1A:
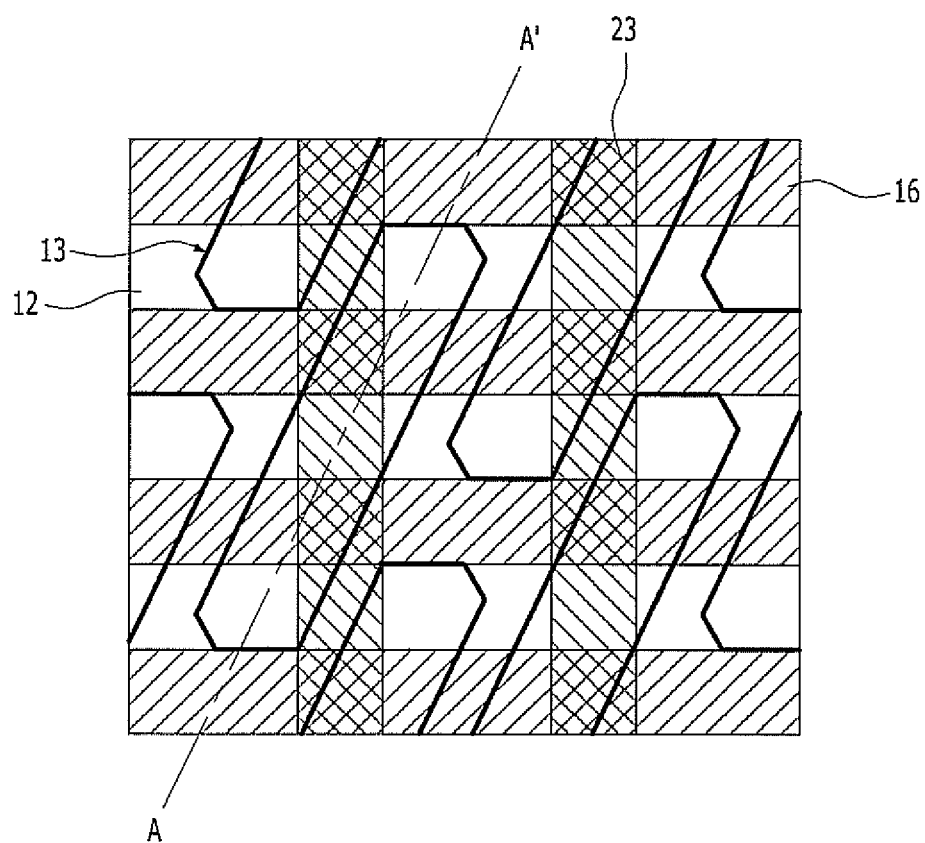
FIGS. 1A and 1B illustrate a conventional semiconductor device with buried gates.
Figure 1B:
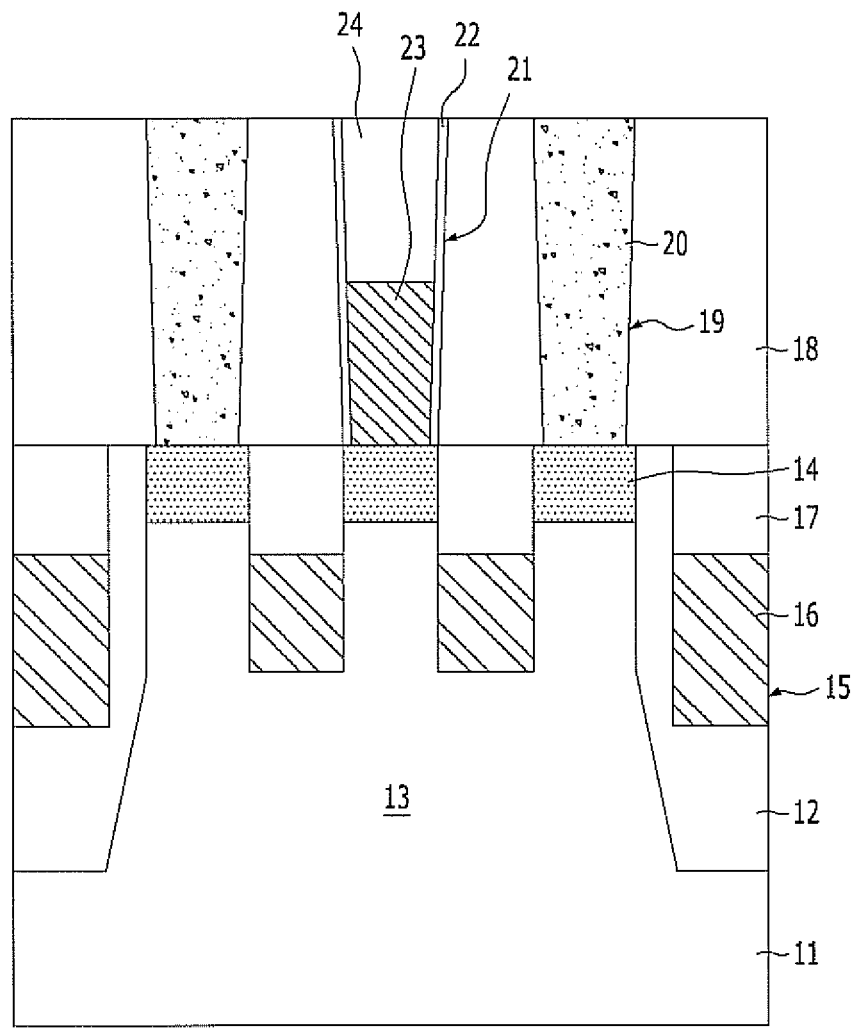

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Described hereafter is a method for fabricating a semiconductor device including buried gates that may improve process margins of a storage node contact plug forming process, prevent a short from being formed between landing plugs coupled with bit lines and storage node contact plugs, and increase the contact area between the landing plugs and the storage node contact plugs (that is, decrease the contact resistance).

Figure 2:
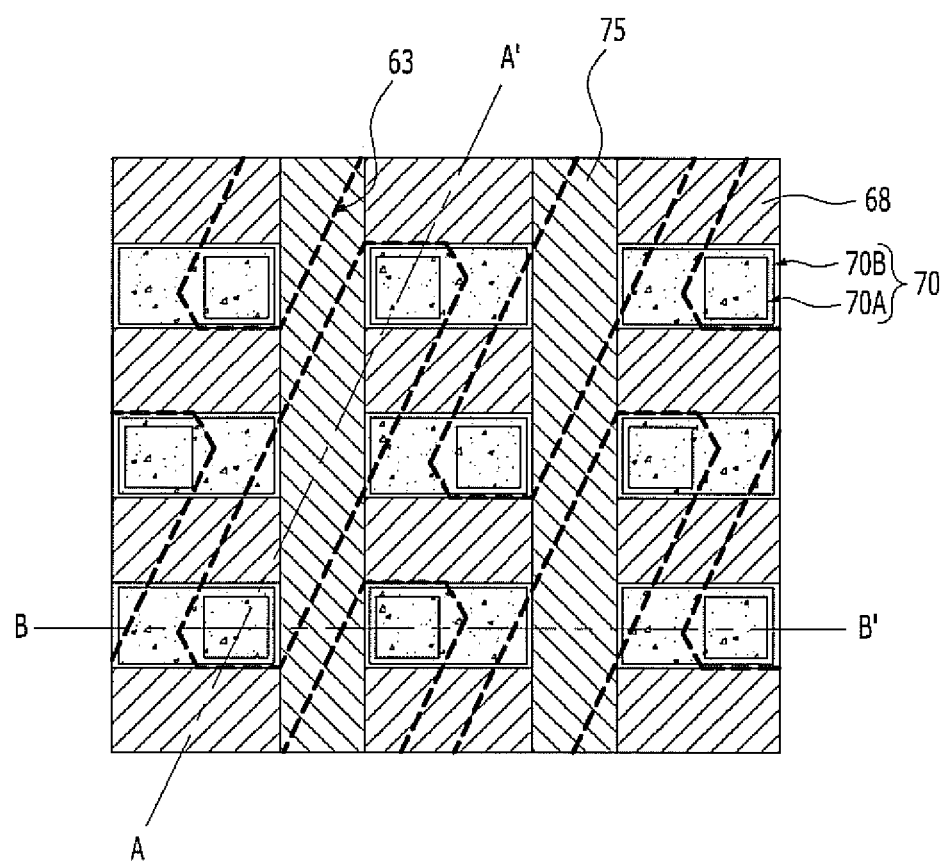
FIG. 2 is a plan view illustrating a semiconductor device including buried gates in accordance with an embodiment of the present invention.
Figure 3:
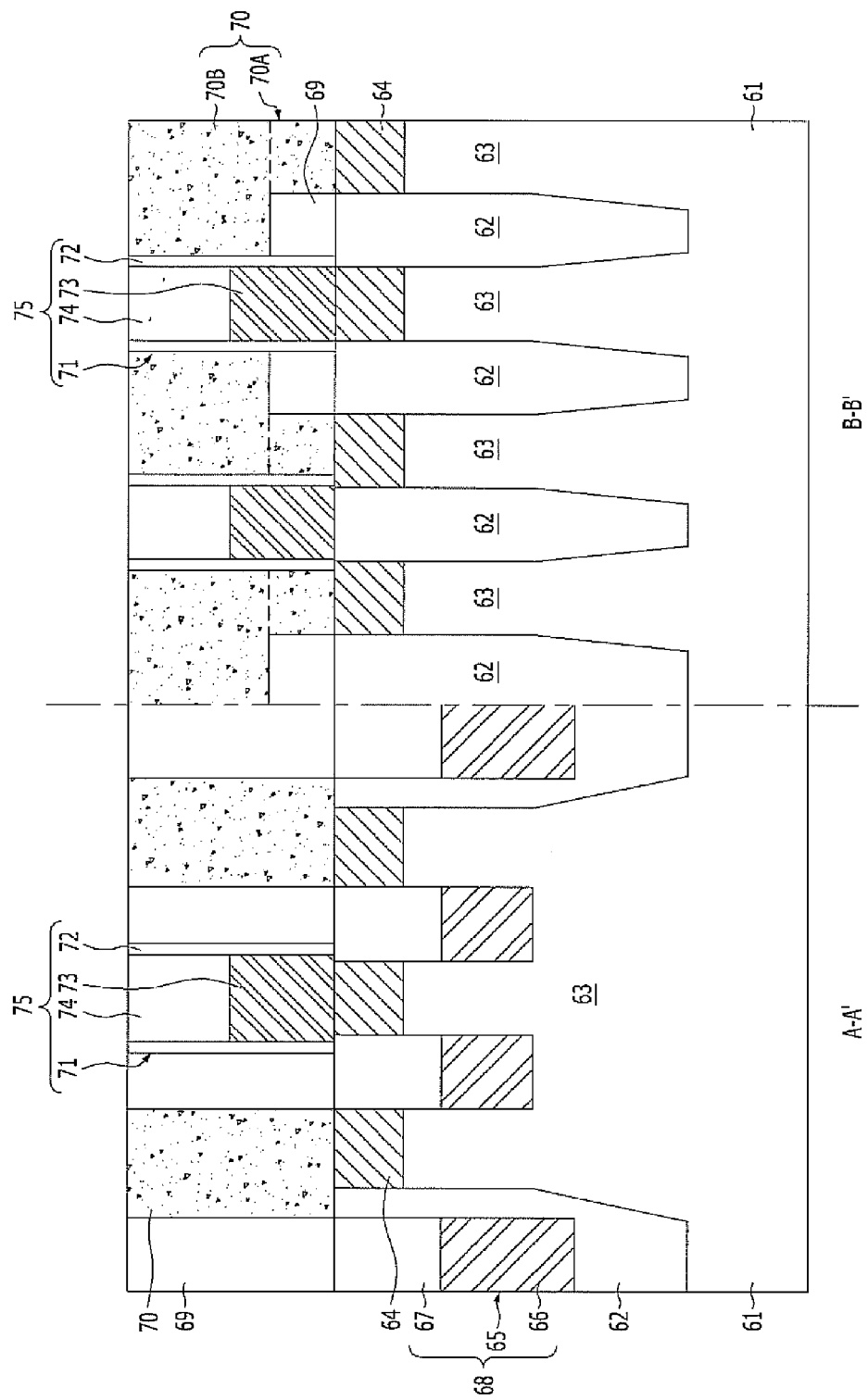
FIG. 3 is a cross-sectional view of the semiconductor device of FIG. 2 along the lines A-A' and B-B'.

FIG. 2 is a plan view illustrating a semiconductor device including buried gates in accordance with an embodiment of the present invention. FIG. 3 is a cross-sectional view of the semiconductor device of FIG. 2 along the lines A-A' and B-B'.

Referring to FIGS. 2 and 3, the semiconductor device fabricated in accordance with the embodiment of the present invention includes buried gates 68 formed over a substrate 61, storage node contact plugs 70 which penetrate an inter-layer dielectric layer 69 and include a pillar pattern 70A and a line pattern 70B over the pillar pattern 70A, and a bit line structure 75 which is formed over the substrate 61 and electrically isolates adjacent storage node contact plugs 70 from each other, where the line pattern 70 are formed in at least two etching steps as described below and a slant in forming the line pattern for storage contact plugs is reduced. Each of the buried gates 68 formed over the substrate 61 includes a trench 65 simultaneously crossing an active region 63 and an isolation layer 62, a gate insulation layer (not shown) formed on the surface of the trench 65, a gate electrode 66 filling a portion of the trench 65, and a gate sealing layer 67 filling the other portion of the trench 65 over the gate electrode 66.

Landing plugs 64 defined by the buried gates 68 and the isolation layer 62 are formed over active regions 63. The landing plugs 64 disposed on the edges of the active regions 63 are coupled with the storage node contact plugs 70, and the landing plugs 64 disposed in the central portions of the active regions 63 are coupled with bit lines 73.

The pillar pattern 70A of each storage node contact plug 70 is disposed to correspond to the landing plug 64 of a predetermined region of each storage node contact plug 70. The pillar pattern 70A secures the contact area between the landing plugs 64 and the storage node contact plugs 70 and at the same time, simplifies a process for forming the storage node contact plugs 70. Here, a short is prevented from being formed between the landing plugs 64 coupled with the bit lines 73 and the storage node contact plugs 70.

The line pattern 70B of each storage node contact plug 70 has a shape that it is extended in a direction parallel to the buried gates 68 between the buried gates 68. More specifically, the line pattern 70B covers a region of each storage node contact plug 70, while being isolated by the bit line structure 75. The line pattern 70B serves to improve the process margins and stability of the storage node contact plugs 70 and at the same time to decrease the resistance of the storage node contact plugs 70 by increasing the volume of the storage node contact plugs 70 that penetrate the inter-layer dielectric layer 69. Moreover, the line pattern 70B serves to improve the contact margin between a storage node (not shown) and the storage node contact plugs 70 by maximizing/increasing the area of the storage node contact plugs 70 exposed on the surface of the inter-layer dielectric layer 69.

The bit line structure 75 electrically disconnecting the adjacent storage node contact plugs 70 from each other includes a damascene pattern 71 penetrating the inter-layer dielectric layer 69 and extended in a direction that the damascene pattern 71 crosses the buried gates 68, bit line spacers 72 formed on the sidewalls of the damascene pattern 71, bit lines 73 filling a portion of the damascene pattern 71, and a bit line sealing layer 74 filling the remaining portion of the damascene pattern 71 over the bit lines 73.

Since the semiconductor device having the above-described structure includes the storage node contact plugs 70, each of which is formed of the pillar pattern 70A and the line pattern 70B, it may prevent a short from being formed between the storage node contact plugs 70 and the landing plugs 64 under the bit lines 73 and prevent a decrease in the contact margin and increase in contact resistance and self-resistance of the storage node contact plugs 70. The semiconductor device also has an advantage of increasing the process margins in the processes of forming the storage node contact plugs 70 and the bit line structure 75, which processes will be described in detail later while describing a method for fabricating a semiconductor device in accordance with an embodiment of the present invention below.

FIGS. 4A to 4K are cross-sectional views illustrating a method for fabricating a semiconductor device including buried gates in accordance with an embodiment of the present invention. FIGS. 5A and 5D are plan views illustrating storage node contact holes in accordance with an embodiment of the present invention.

Referring to FIG. 4A, a first hard mask pattern 32 where a pad oxide layer 32A and a hard mask polysilicon layer 32B are sequentially stacked is formed over a substrate 31 having a cell region and a peripheral region. The first hard mask pattern 32 may be formed to have a thickness ranging from approximately 600 Å to approximately 1,500 Å in consideration of the depth of isolation trenches and the height of landing plugs to be formed subsequently.

Subsequently, an isolation layer 33 defining active regions 34 is formed by using the first hard mask pattern 32 as an etch barrier and etching the substrate 31 to thereby form isolation trenches and filling the isolation trenches with an insulating material.

Subsequently, grooves 35 exposing the active regions 34 are formed by selectively removing the first hard mask pattern 32 in the cell region. The grooves 35 provide the space where landing plugs are to be formed.

Figure 4B:
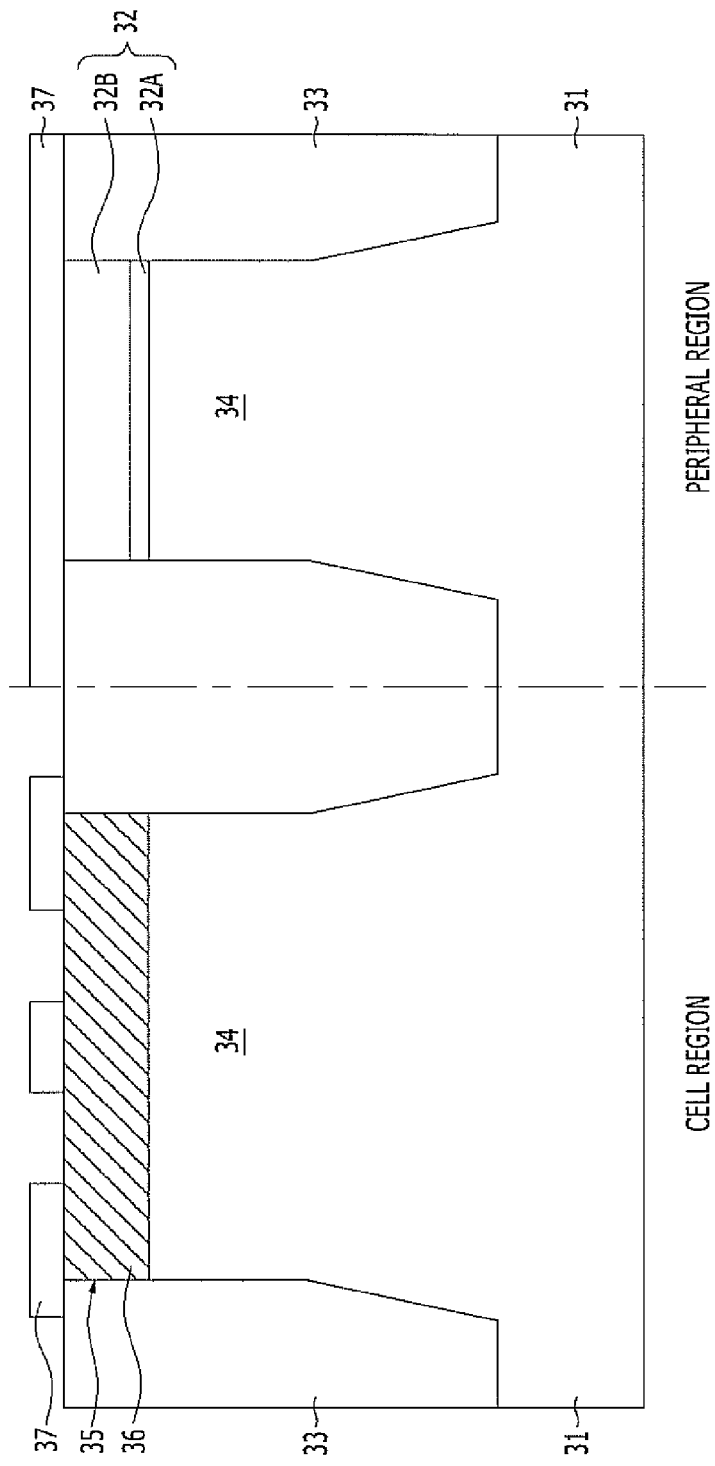
Figure 5A:
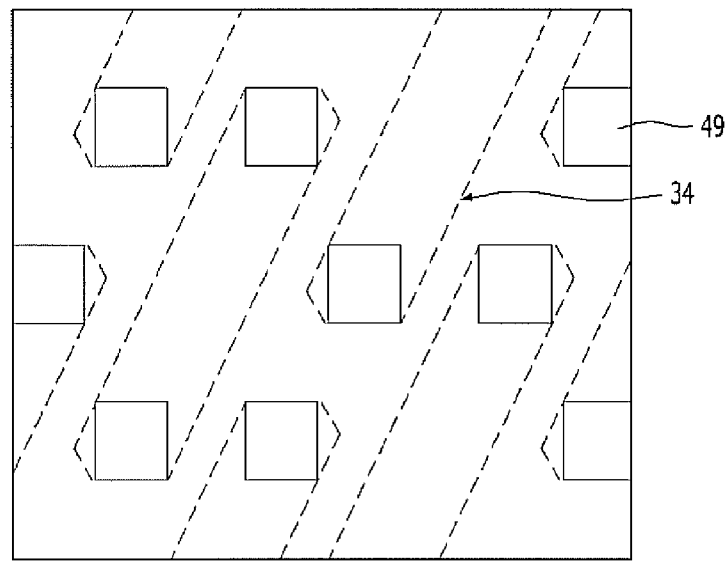
FIGS. 5A and 5D are plan views illustrating storage node contact holes in accordance with an embodiment of the present invention.

Referring to FIG. 4B, a conductive layer 36 for forming landing plugs is formed over the substrate 31 to fill the grooves 35, and a planarization process is performed until the isolation layer 33 is exposed. The landing-plug-forming conductive layer 36 may be a polysilicon layer, and the planarization process may be a Chemical Mechanical Polishing (CMP) process.

Subsequently, a second hard mask pattern 37 is formed over the substrate 31 where the landing-plug-forming conductive layer 36 is already formed in order to form buried gates in the cell region. The second hard mask pattern 37 is patterned in the cell region and covers the peripheral region. The second hard mask pattern 37 may be a nitride layer.

Figure 4C:
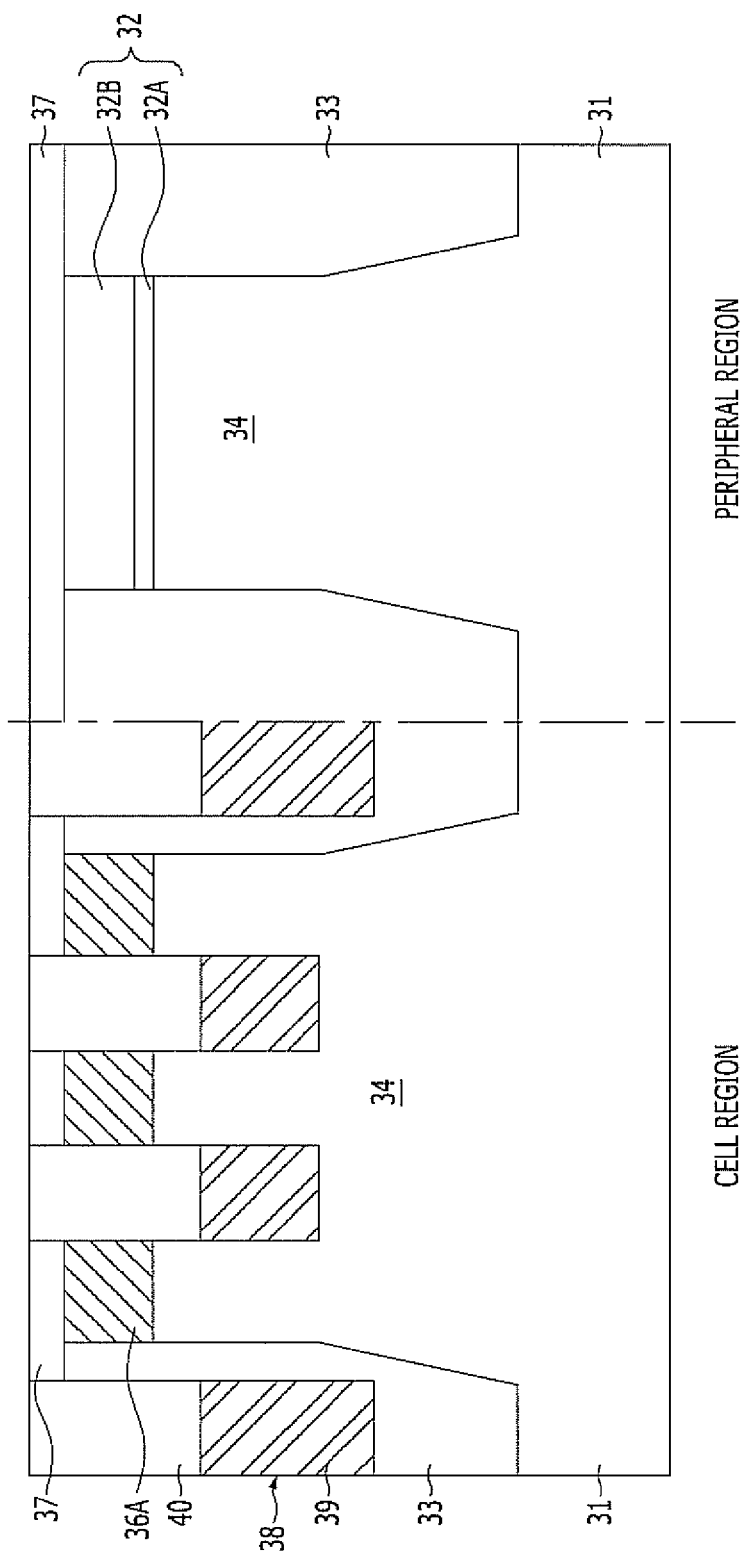

Referring to FIG. 4C, line-type trenches 38 crossing the active regions 34 and the isolation layer 33 are formed by using the second hard mask pattern 37 as an etch barrier and etching the landing-plug-forming conductive layer 36, the active regions 34 and the isolation layer 33. After the line-type trenches 38 are formed, the landing-plug-forming conductive layer 36 becomes landing plugs 36A. The landing plugs 36A disposed on the edge of both sides of each active region 34 are coupled with storage node contact plugs through a subsequent process, and the landing plugs 36A disposed in the central portion of each active region 34 are coupled with subsequently formed bit lines.

Subsequently, a gate insulation layer (not shown) is formed on the surface of the line-type trenches 38. The gate insulation layer may be a silicon oxide ($SiO_2$) layer formed through a thermal oxidation process.

Subsequently, a gate electrode 39 is formed to fill a portion of each line-type trench 38. The gate electrode 39 may be a metallic layer including a metal layer, a metal oxide layer, a metal nitride layer, and a metal silicide layer.

Subsequently, a gate sealing layer 40 filling the other portion of each line-type trench 38 is formed over the gate electrode 39. The gate sealing layer 40 may be a nitride layer.

A plurality of buried gates may be formed in the cell region of the substrate 31 through the above-described process, and the second hard mask pattern 37 formed in the peripheral region during the buried gates formation process may protect the peripheral region of the substrate 31 from being damaged or lost.

Figure 4D:
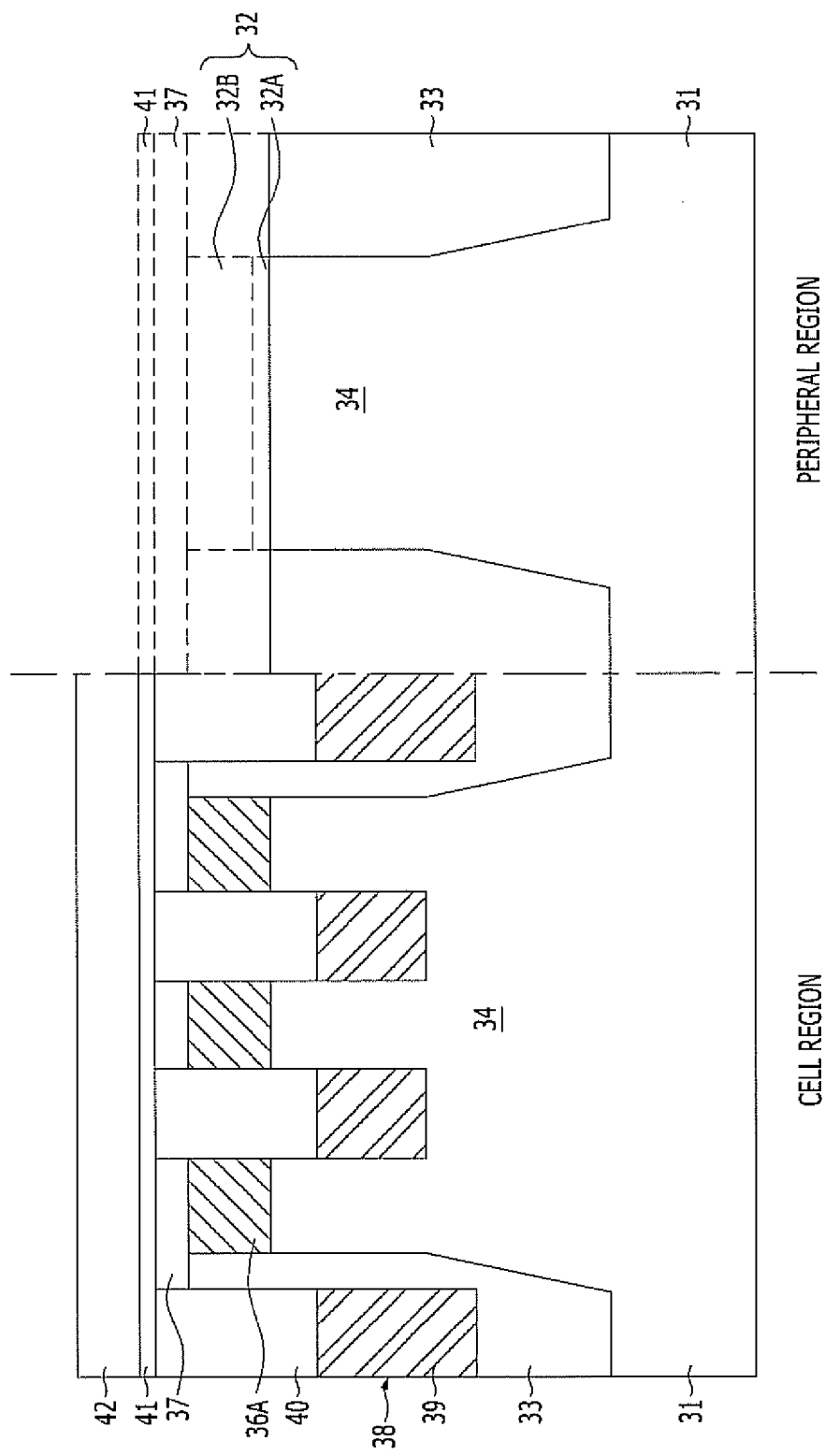

Referring to FIG. 4D, a first etch stop layer 41 (for example, an insulation layer) is formed over the substrate 31. The first etch stop layer 41 protects the lower layers from being damaged undesirably while a damascene pattern formation process for forming bit lines and a storage node contact hole formation process are performed subsequently, and thus, first etch stop layer 41 provides an etch stop point.

Subsequently, a capping layer 42 is formed over the first etch stop layer 41 to cover the cell region and open the peripheral region. The capping layer 42 is a single layer selected from the group consisting of an oxide layer, a nitride layer, and an oxynitride layer, or a stacked layer where more than two of the foregoing layers are stacked.

Subsequently, the active regions 34 of the peripheral region are exposed by using the capping layer 42 as an etch barrier and removing the first etch stop layer 41, the second hard mask pattern 37 and the first hard mask pattern 32 that are formed in the peripheral region. While the first hard mask pattern 32 is removed, a portion of the isolation layer 33 may be lost, and to facilitate a subsequent process, the surface of the active regions 34 and the surface of the isolation layer 33 in the peripheral region may be made to have the same height (for example, by etching).

Figure 4E:
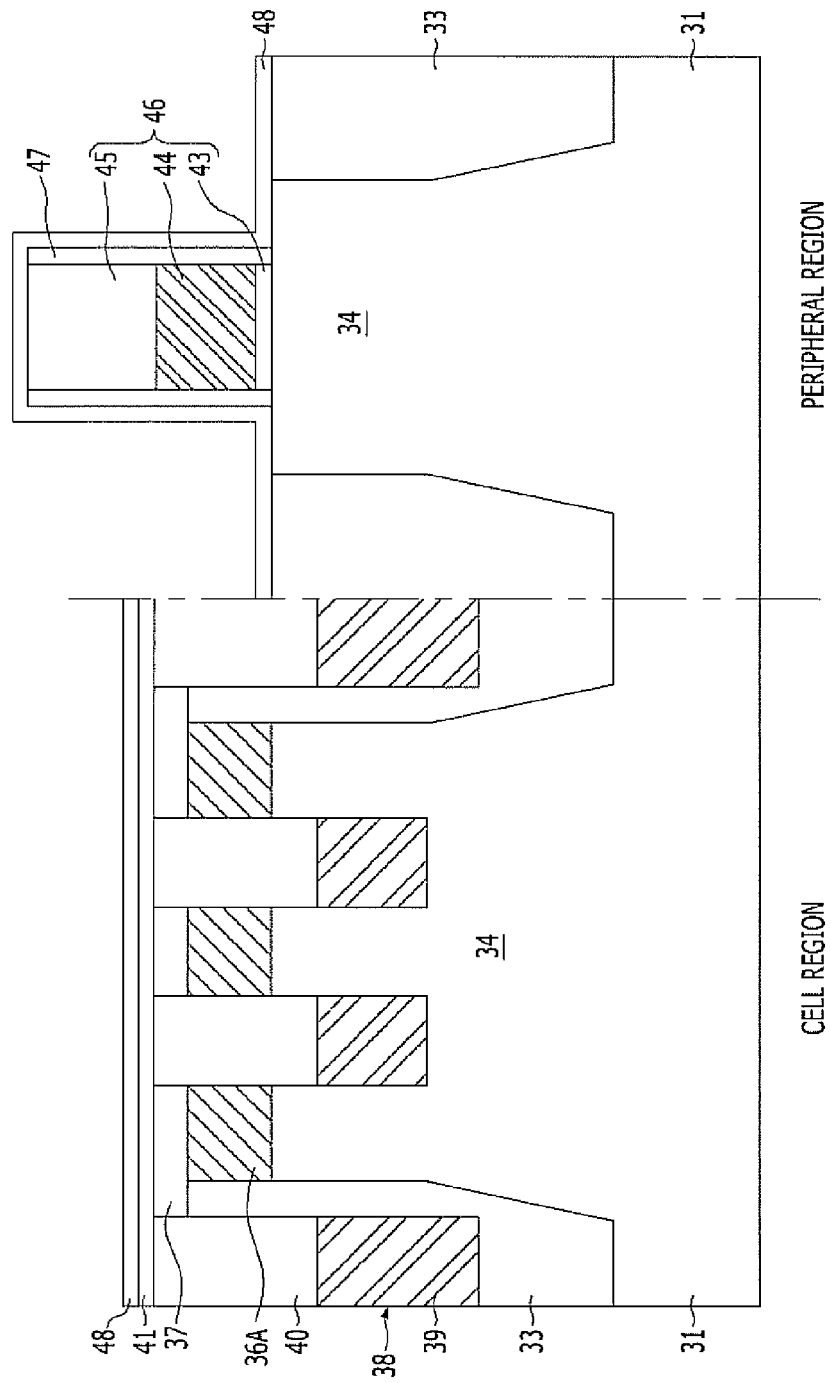

Referring to FIG. 4E, peripheral gates 46 are formed in the peripheral region of the substrate 31. The peripheral gates 46 may be a stacked structure where a peripheral gate insulation layer 43, a peripheral gate electrode 44, and a peripheral gate hard mask layer 45 are sequentially stacked. Here, all of the capping layer 42 of the cell region may be removed in the course of forming the peripheral gates 46.

According to an example, the height of the peripheral gates 46 may be formed to be low to improve the stability of a subsequent process for forming an inter-layer dielectric layer. Here, the height of the peripheral gates 46 may be formed to be on the same plane as the upper surface of storage node contact plugs, which are to be formed in the cell region. For example, the peripheral gate hard mask layer 45 may have a thickness of approximately 300 Å to approximately 800 Å after the completion of the peripheral gates forming process. According to another example, the peripheral gate hard mask layer 45 may have a thickness of approximately 300 Å to approximately 2,500 Å as appropriate.

Subsequently, spacers 47 are formed on both sidewalls of each peripheral gate 46. The spacers 47 may be formed of a nitride.

Subsequently, a sealing layer 48 of a desired thickness is formed along the surface of the structure including the peripheral gates 46. The sealing layer 48 serves to protect the peripheral gates 46 during a subsequent process for forming storage node contact holes and may be formed to have a thickness ranging from approximately 50 Å to approximately 200 Å. The sealing layer 48 may be formed of a material having an etch selectivity with respect to the first etch stop layer 41. For example, the sealing layer 48 may be an oxide layer.

Figure 4F:
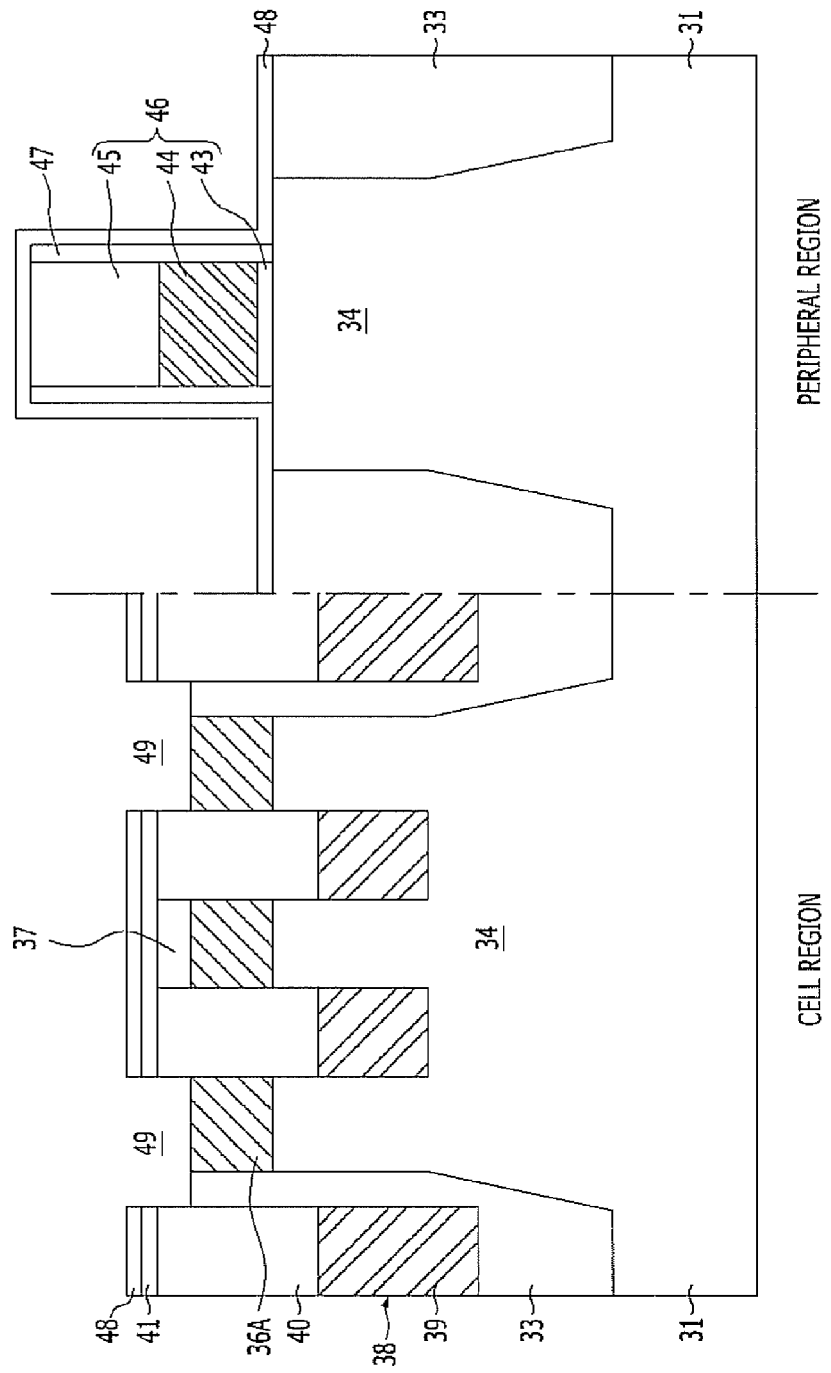

Referring to FIG. 4F, a first pattern 49 exposing the landing plugs 36A of a region where storage node contact plugs are to be formed is formed by selectively etching the sealing layer 48 of the cell region, the first etch stop layer 41, the isolation layer 33, and the gate sealing layer 40. The first pattern 49 serves as a part of storage node contact holes, and the first pattern 49 is formed to expose the upper surface of the landing plugs 36A disposed in the region where storage node contact plugs are to be formed as much as possible.

Figure 5B:
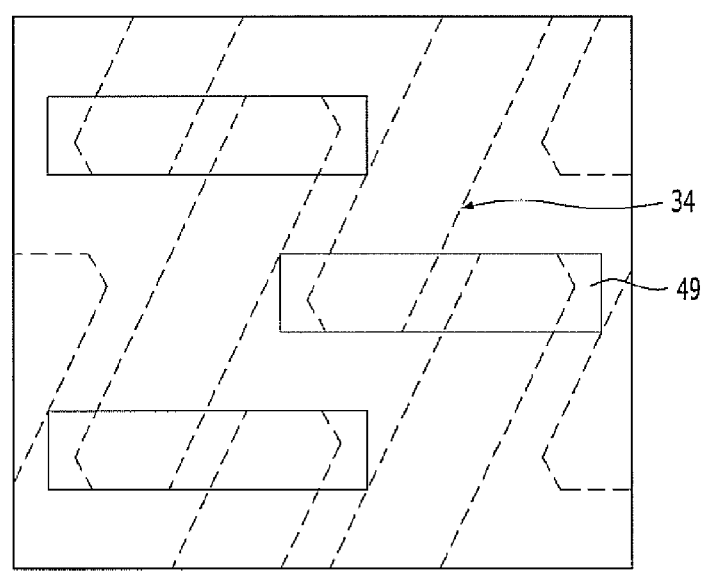

The first pattern 49 may be formed in a hole type (see FIG. 5A) which exposes all the region where storage node contact plugs are to be formed, or it may be formed in a bar type (see FIG. 5B) which simultaneously exposes an adjacent region and the region where storage node contact plugs are to be formed.

According to another example, the first pattern 49 may be formed in a shape which exposes all the landing plugs 36A of the region except a region where bit lines are to be formed by forming a photoresist layer pattern cover the region where bit lines are to be formed over the sealing layer 48, by using the photoresist layer pattern as an etch barrier and performing a blanket etch process. Here, the photoresist layer pattern may have a shape covering a region where bit lines are to be formed. It is more advantageous to form the first pattern 49 through the above-described method than to form the first pattern 49 in the hole type or the bar type because the pattern formation process may be simplified in the above-described method.

Herein, according to the embodiment of the present invention, since the first pattern 49 is formed by selectively etching the sealing layer 48, the first etch stop layer 41, the isolation layer 33 and the gate sealing layer 40, the sidewalls of the first pattern 49 may be formed vertically, and the upper surface of the landing plugs 36A in the region where storage node contact plugs are to be formed may be opened so as to provide a sufficient contact area. Also, since the process of forming the first pattern 49 may be simplified, the landing plugs 36A to be coupled with bit lines may be prevented from being exposed due to causes such as misalignment occurring during a process for forming storage node contact holes. In other words, a short is prevented from being formed between storage node contact plugs and the landing plugs 36A coupled with bit lines.

Figure 4G:
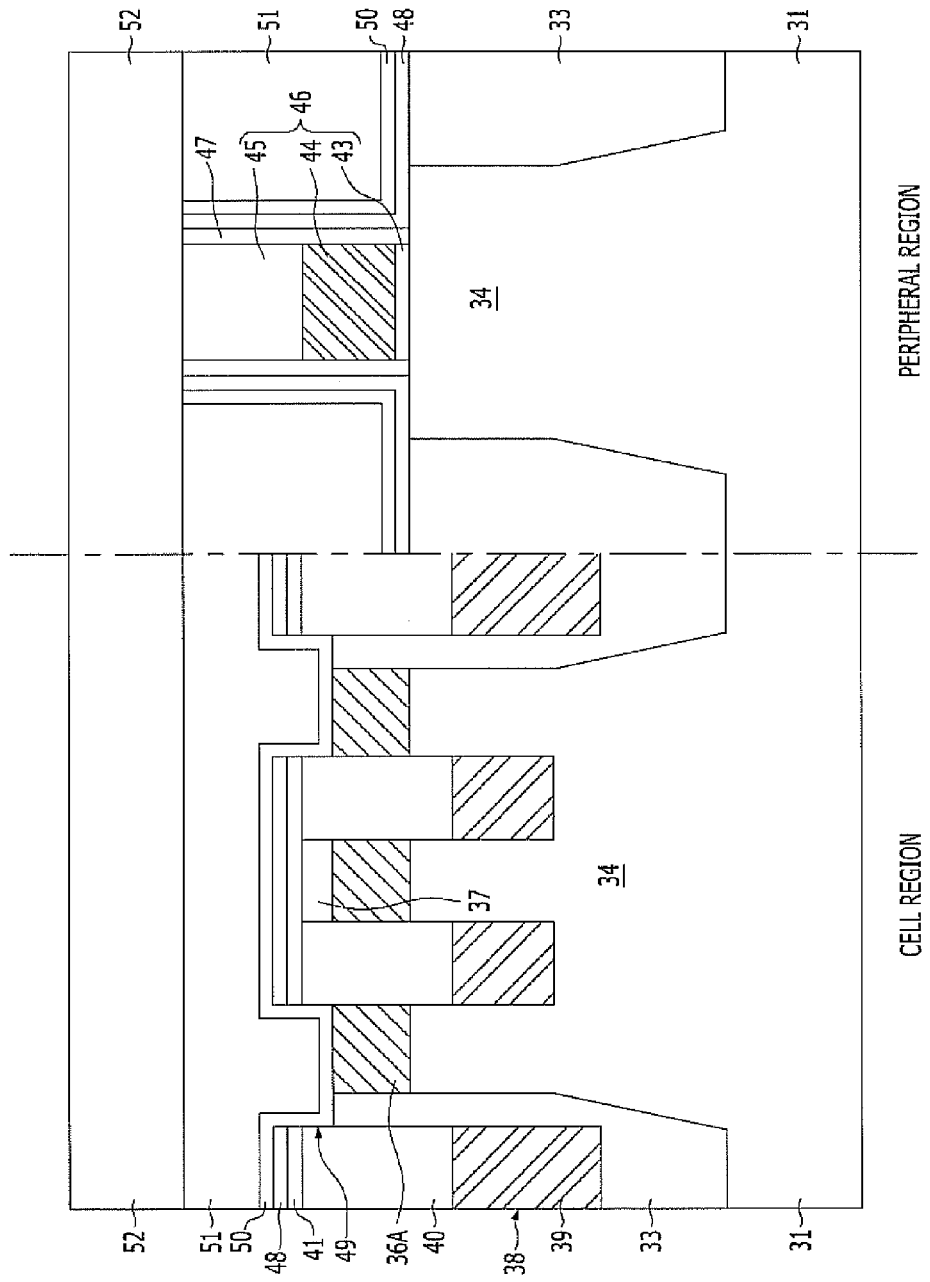

Referring to FIG. 4G, a second etch stop layer 50 (e.g., an insulation layer) is formed with a uniform thickness along the surface of the resulting structure including the first pattern 49. The second etch stop layer 50 protects the lower structure from being damaged during a subsequent storage node contact hole formation process and operates as an etch stop. The second etch stop layer 50 may be formed to have a thickness ranging from approximately 50 Å to approximately 200 Å, and it may be formed of a material having an etch selectivity with respect to the sealing layer 48. For example, the second etch stop layer 50 may be a nitride layer.

Subsequently, a first inter-layer dielectric layer 51 is formed over the substrate 31 including the first pattern 49 in such a manner that the first inter-layer dielectric layer 51 covers the peripheral gates 46, and a planarization process is performed until the peripheral gate hard mask layer 45 is exposed. The first inter-layer dielectric layer 51 may be an oxide layer or it may be formed of boro-phospho silicate glass (BPSG) or a spin-on dielectric (SOD) substance, which has excellent flow characteristics. The planarization process may be Chemical Mechanical Polishing (CMP) process.

Subsequently, a second inter-layer dielectric layer 52 is formed over the first inter-layer dielectric layer 51. The second inter-layer dielectric layer 52 provides the cell region with a sufficient height to allow formation of bit lines. The second inter-layer dielectric layer 52 may be formed of the same material as the first inter-layer dielectric layer 51 to facilitate a subsequent process. Also, the second inter-layer dielectric layer 52 may be formed of a material whose layer density is higher than that of the first inter-layer dielectric layer 51 to effectively prevent the profile of sidewalls from being deformed and to present a short from being formed between the sidewalls during the subsequent process for forming storage node contact holes and a subsequent process for forming a damascene pattern for bit lines. For example, the second inter-layer dielectric layer 52 may be an oxide layer, such as a High-Density Plasma (HDP) oxide layer or a tetra ethyl ortho silicate (TEOS) layer.

When the height of the peripheral gates 46 is low as described above, an inter-layer dielectric layer (51 and 52) may be formed through a series of processes of forming the first inter-layer dielectric layer 51 and then performing a planarization process to enhance the thickness stability of the first inter-layer dielectric layer 51 and through forming the second inter-layer dielectric layer 52. When the height of the peripheral gates 46 is sufficiently high, the inter-layer dielectric layer (51 and 52) may be formed by performing the formation of a dielectric layer just once and performing a planarization process.

Figure 5C:
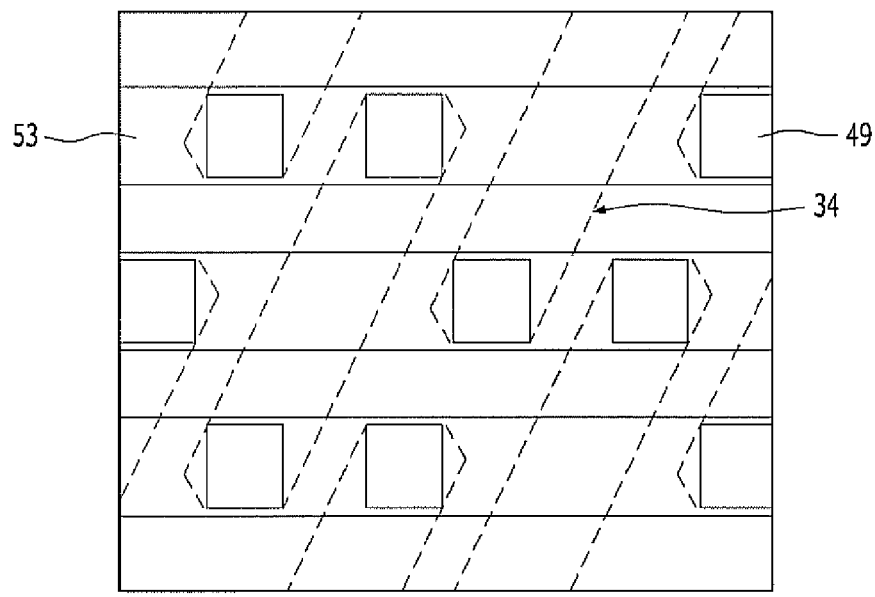
Figure 5D:
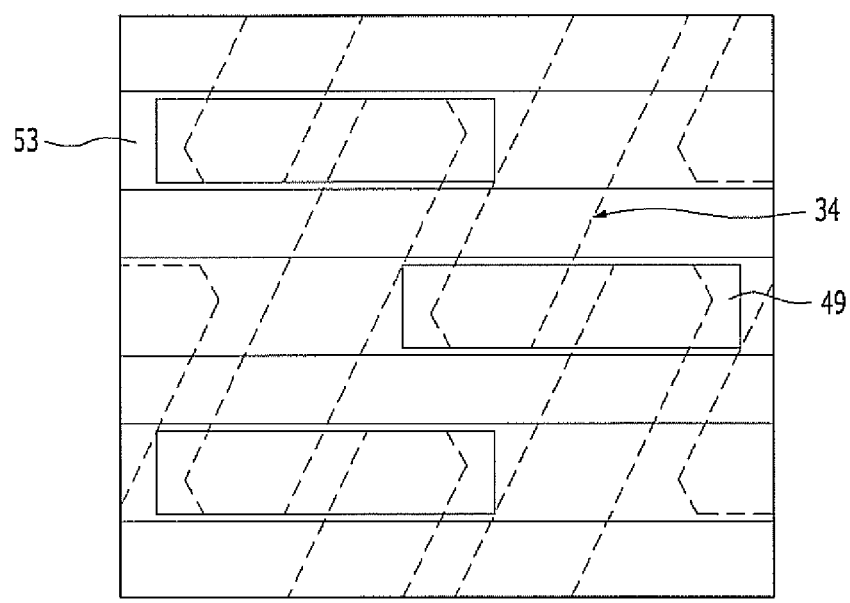

Referring to FIG. 4H, a line-type second pattern 53 which is extended in a direction parallel to buried gates and coupled with the first pattern 49 (for example, an outline of contact holes previously formed by second hard mask pattern 37 in FIG. 4D before being removed during the formation of the first pattern) is formed by selectively etching the first inter-layer dielectric layer 51 and the second inter-layer dielectric layer 52 until the second etch stop layer 50 is exposed. As a result, storage node contact holes formed of the first pattern 49 and the second pattern 53 are formed (see FIGS. 5C and 5D), where the second etch stop layer 50 will also be removed subsequently.

In forming the second pattern 53 as a line type by etching the first inter-layer dielectric layer 51 and the second inter-layer dielectric layer 52, process margins and stability may be improved, where the space for storage node contact plugs 70 are formed in two etching steps (that is, one for the first pattern and one for the second pattern) and a slant in forming for storage node contact plugs 70 may be reduced.

Subsequently, the landing plugs 36A of a region where storage node contact plugs are to be formed are exposed by selectively removing the second etch stop layer 50 that is exposed through the line-type second pattern 53. The line-type second pattern 53 disposed in a region where bit lines are to be formed has an etch process stop at the first etch stop layer 41. This is to protect the landing plugs 36A disposed in the region where bit lines are to be formed from being damaged during the storage node contact hole formation process or to prevent a short from being formed between the landing plugs 36A and storage node contact holes.

According to the embodiment of the present invention, sufficient contact area may be secured between the storage node contact plugs and the landing plugs 36A due to the presence of the first pattern 49 even if the sidewalls of the line-type second pattern 53 may be slightly slanted due to the etch characteristics during the process of forming the line-type second pattern 53.

Figure 4I:
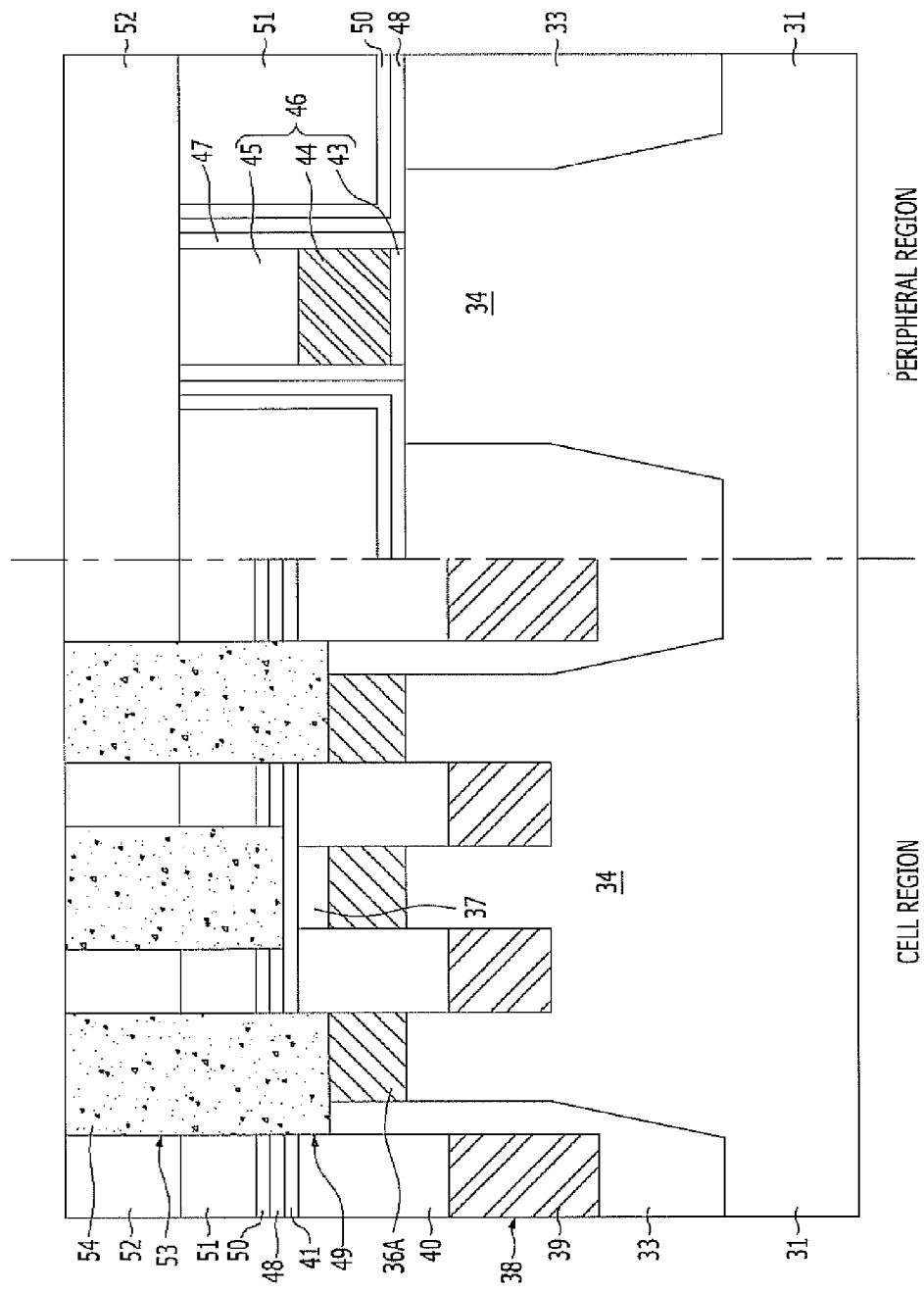

Referring to FIG. 4I, a conductive layer 54 for storage node contact plugs filling the storage node contact holes, each of which is formed of the first pattern 49 and the line-type second pattern 53, are formed. The storage node contact plug-forming conductive layer 54 may be a polysilicon layer.

Here, since the first etch stop layer 41 remains in the lower portion of the line-type second pattern 53 disposed in the region where bit lines are to be formed, a short may be prevented from being formed between the storage node contact-plug-forming conductive layer 54 and the landing plugs 36A.

Figure 4J:
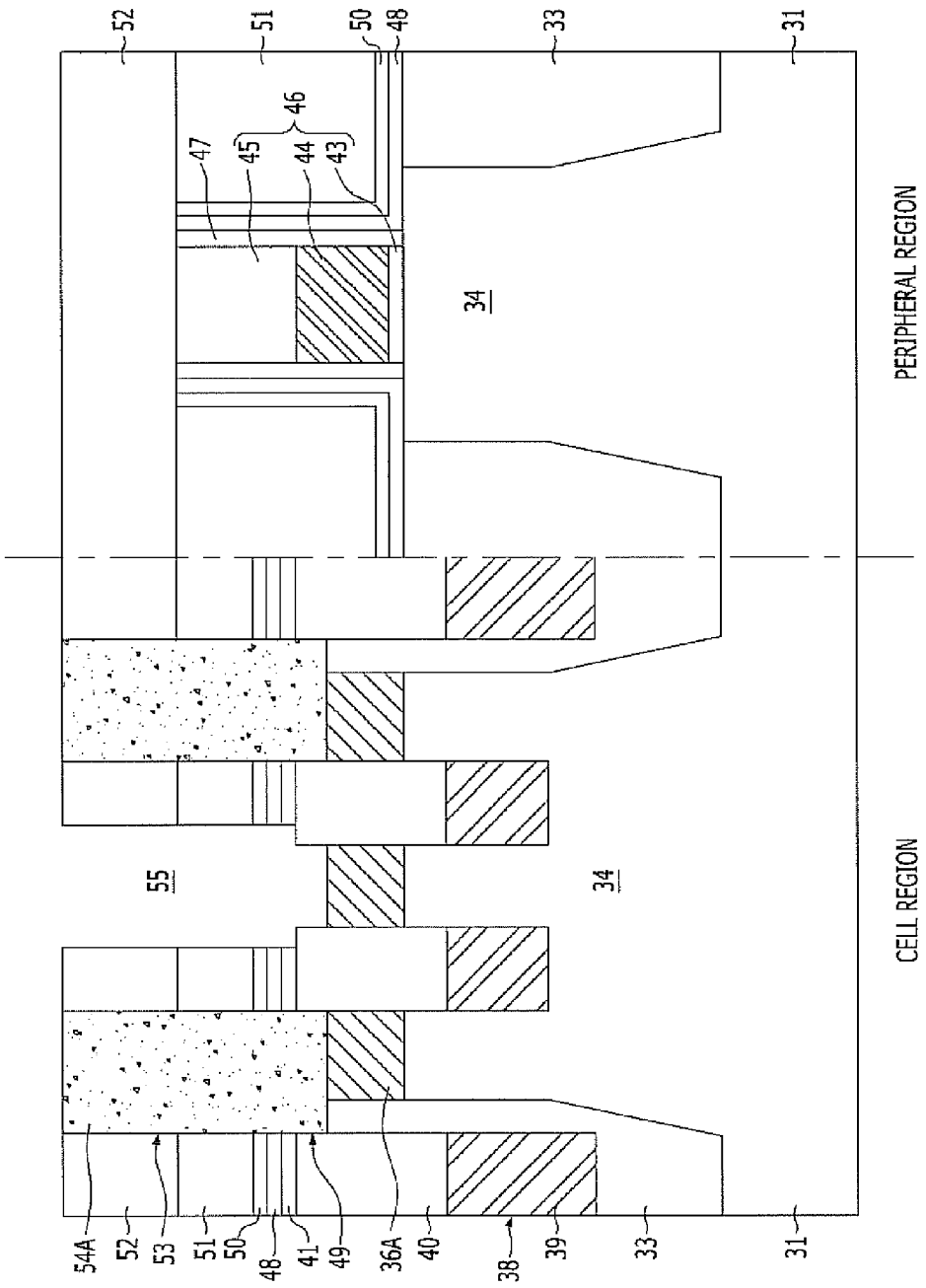

Referring to FIG. 4J, the landing plugs 36A are selectively exposed by selectively etching the storage node contact-plug-forming conductive layer 54, the second inter-layer dielectric layer 52, the first inter-layer dielectric layer 51, the second etch stop layer 50, the sealing layer 48, the first etch stop layer 41, the second hard mask pattern 37, and the gate sealing layer 40. Accordingly, line-type damascene pattern 55 extended in a direction crossing the direction that the buried gates are extended is formed. Here, portions of the line-type damascene pattern 55 form storage node contact plugs 54A.

Figure 4K:
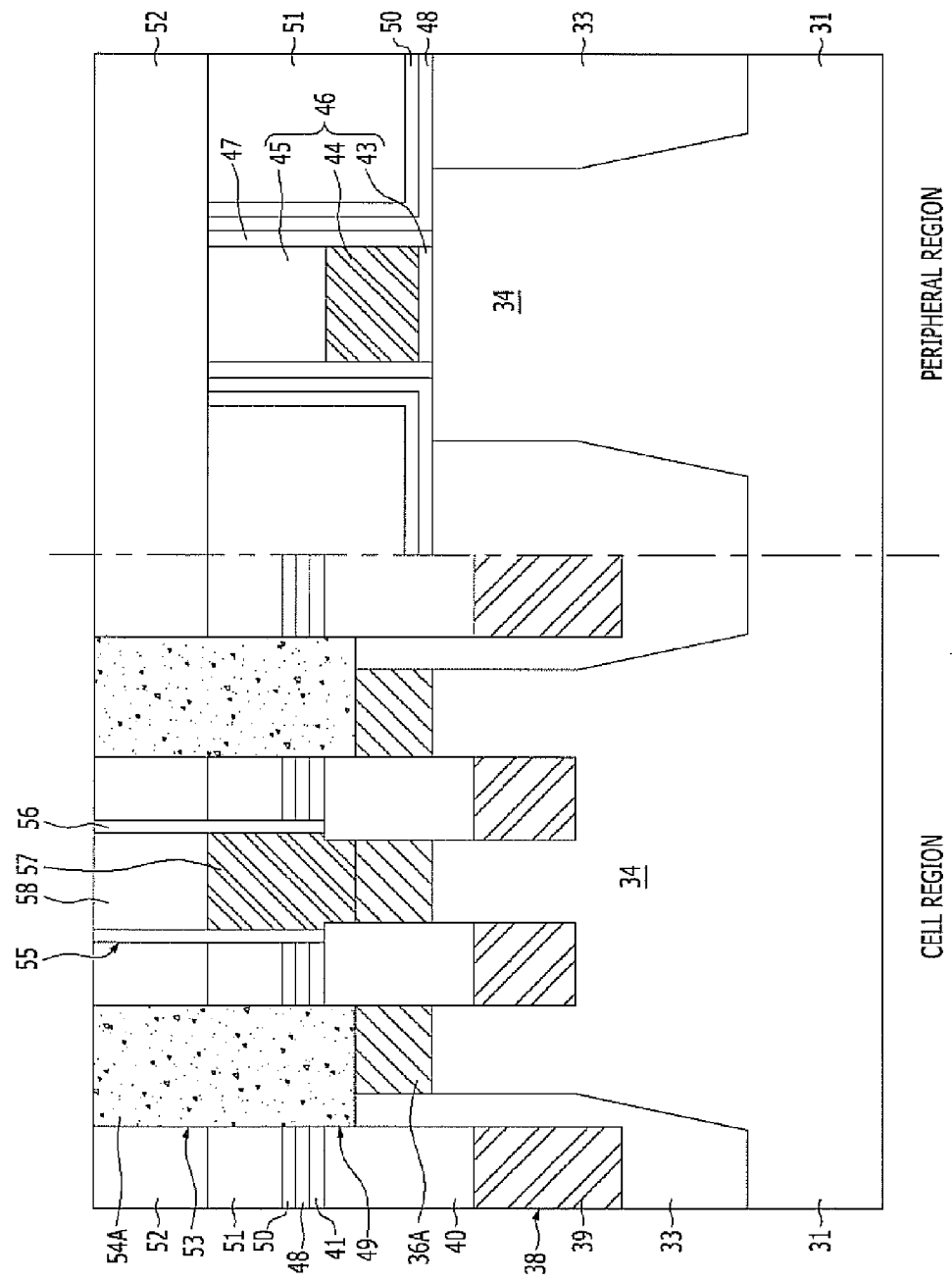

Referring to FIG. 4K, bit line spacers 56 are formed on the sidewalls of the line-type damascene pattern 55. The bit line spacers 56 may be a single layer selected from the group consisting of an oxide layer, a nitride layer, and an oxynitride layer, or a stacked layer including more than two of the foregoing layers.

Meanwhile, an etching process is performed until the first etch stop layer 41 is exposed during the process of forming the line-type damascene pattern 55, and the landing plugs 36A under the second hard mask pattern 37 may be exposed by removing the sealing layer 48 and the second hard mask pattern 37 while forming the bit line spacers 56 at the same time.

Subsequently, bit lines 57 filling a portion of the line-type damascene pattern 55 are formed. The bit lines 57 may be formed of a metallic layer. Here, an ohmic contact layer (not shown) may be formed between the bit lines 57 and the landing plugs 36A.

Subsequently, a bit line sealing layer 58 filling the other portion of the line-type damascene pattern 55 is formed over the bit lines 57. The bit line sealing layer 58 may be a single layer selected from the group consisting of an oxide layer, a nitride layer, and an oxynitride layer, or a stacked layer including more than two of the foregoing layers.

The semiconductor device fabrication method in accordance with the embodiment of the present invention may improve the process margins of the storage node contact plugs 54A formation process, prevent a short from being formed between the landing plugs 36A coupled with the bit lines 57 and the storage node contact plugs 54A, and secure a sufficient contact area between the landing plugs 36A and the storage node contact plugs 54A by forming the storage node contact holes from the first pattern 49 and the line-type second pattern 53. In addition, the semiconductor device fabrication method in accordance with the embodiment of the present invention may increase the contact margin between storage nodes which are to be formed through a subsequent process and the storage node contact plugs 54A.

According to the semiconductor device fabrication method in accordance with an embodiment of the present invention, a short between the landing plugs coupled with bit lines and storage node contact plugs may be prevented from being formed by dividing storage node contact holes into a first pattern and a second pattern and providing storage node contact plugs including a pillar pattern and a line pattern. Further, contact margins of the storage node contact plugs may be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first layer over a substrate;
    forming a first pattern which exposes the substrate by selectively etching the first layer;
    forming a second layer to cover the substrate;
    forming a line-type second pattern coupled with the first pattern by selectively etching the second layer;
    forming a conductive layer to fill the first pattern and the second pattern; and
    selectively etching the conductive layer to form contact plugs and a damascene pattern after the forming of the second pattern.

2. The method of claim 1, wherein the first pattern is formed as a hole type that opens regions of the substrate where the contact plugs are to be formed.

3. The method of claim 1, wherein the first pattern is formed as a bar type that opens regions of the substrate where the contact plugs are to be formed and respective adjacent regions.

4. The method of claim 1, wherein the forming of the contact plugs comprises:
    forming a line pattern by selectively etching the first layer, the second layer, and the conductive layer.

5. The method of claim 4, wherein the line pattern crosses the second pattern.

6. A method for fabricating a semiconductor device, comprising:
    forming buried gates over a substrate;
    forming a first layer over the substrate;
    forming a first pattern by selectively etching the first layer;
    forming a second layer over the substrate including the first pattern;
    forming a line-type second pattern coupled with the first pattern and selectively etching the second layer;
    forming a conductive layer that fills storage node contact holes including the first pattern and the second pattern; and
    forming storage node contact plugs by selectively etching the conductive layer, the second layer, and the first layer to form a damascene pattern simultaneously.

7. The method of claim 6, further comprising:
    forming bit line spacers on sidewalls of the damascene pattern;
    forming bit lines filling a portion of the damascene pattern; and
    forming a bit line sealing layer over the bit lines to fill the remaining portion of the damascene pattern.

8. The method of claim 6, wherein the first pattern is formed as a hole type that exposes regions of the substrate where the storage node contact plugs are to be formed.

9. The method of claim 6, wherein the first pattern is formed as a bar type that opens regions of the substrate where the storage node contact plugs are to be formed and respective adjacent regions.

10. The method of claim 6, wherein the forming of the first pattern comprises:
    forming a photoresist layer pattern over the first layer to cover a region where the bit lines are to be formed; and
    performing a blanket etch process by using the photoresist layer pattern until the substrate is exposed.

11. The method of claim 6, wherein lines of the second pattern is formed to each extend in a direction parallel to a direction that the buried gates extend.

12. The method of claim 6, wherein the forming of the line-type second pattern coupled with the first pattern includes stopping an etch process at the second layer to obtain the second pattern and selectively removing the second layer using the second pattern.

13. The method of claim 6, wherein the first layer comprises a nitride layer and the second layer comprises an oxide layer.

14. The method of claim 6, wherein the damascene pattern is formed as a line pattern extended in a direction crossing the buried gates and the second pattern.

15. The method of claim 6, wherein the second layer is formed to occupy a same space outlining the first pattern before the selective etching of the first layer.

16. The method of claim 6, further comprising forming a bit line structure including a bit line in the damascene pattern, wherein the first layer remains in a region of the substrate over which the bit line structure is to be formed after the selective etching of the first layer.

17. The method of claim 6, further comprising forming landing plugs located under the storage node contact plugs, respectively, wherein the landing plugs each have a width narrower than a width of the respective storage node contact plug.

18. The method of claim 6, further comprising forming an additional layer over the second layer to fill the first pattern and extend over the substrate obtained after the forming of the first pattern in height, wherein the forming of line-type second pattern includes etching the additional layer so that the second pattern and the first pattern combined creates an overall pattern deeper in depth than the etched depth of the substrate in the selective etching of the first layer.

* * * * *